(12) United States Patent
Naveh et al.

(10) Patent No.: US 10,984,861 B1
(45) Date of Patent: Apr. 20, 2021

(54) REFERENCE CIRCUITS AND METHODS FOR RESISTIVE MEMORIES

(71) Applicant: Adesto Technologies Corporation, Santa Clara, CA (US)

(72) Inventors: Ishai Naveh, San Jose, CA (US); Venkatesh P. Gopinath, Fremont, CA (US); John Dinh, Dublin, CA (US); Mark T. Ramsbey, Sunnyvale, CA (US)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 16/032,012

(22) Filed: Jul. 10, 2018

Related U.S. Application Data

(60) Provisional application No. 62/531,488, filed on Jul. 12, 2017.

(51) Int. Cl.
*G11C 13/00* (2006.01)

(52) U.S. Cl.
CPC ........ *G11C 13/004* (2013.01); *G11C 13/0069* (2013.01); *G11C 13/0097* (2013.01); *G11C 2013/0054* (2013.01)

(58) Field of Classification Search
None
See application file for complete search history.

(56) References Cited

U.S. PATENT DOCUMENTS

| | | | |
|---|---|---|---|
| 5,761,115 A | 6/1998 | Kozicki et al. | |
| 6,635,914 B2 | 10/2003 | Kozicki et al. | |
| 6,946,882 B2 | 9/2005 | Gogl et al. | |
| 7,251,178 B2 | 7/2007 | Gogl et al. | |
| 7,321,507 B2* | 1/2008 | Yang | G11C 7/14 365/158 |
| 7,359,236 B2 | 4/2008 | Gilbert | |
| 7,382,644 B2* | 6/2008 | Rinerson | G11C 13/0007 365/148 |
| 7,391,639 B2 | 6/2008 | Gogl | |
| 7,428,163 B2 | 9/2008 | Hoenigschmid et al. | |
| 7,433,253 B2 | 10/2008 | Gogl et al. | |
| 7,495,971 B2 | 2/2009 | Egerer | |
| 7,499,344 B2 | 3/2009 | Nirschl et al. | |
| 7,514,706 B2 | 4/2009 | Gilbert | |
| 7,706,176 B2* | 4/2010 | Dittrich | G11C 7/14 365/158 |
| 8,107,273 B1 | 1/2012 | Hollmer et al. | |
| 8,274,842 B1 | 9/2012 | Hollmer et al. | |
| 8,493,776 B1* | 7/2013 | Yu | G11C 29/74 365/158 |
| 8,531,863 B2 | 9/2013 | Symanczyk et al. | |

(Continued)

*Primary Examiner* — Tan T. Nguyen (57) ABSTRACT

A memory device can include a plurality of memory cells formed in a substrate, each having a resistive element programmable between at least two different resistance states, including memory cells configured to store data received by the memory device, and reference cells; a reference circuit formed in the substrate configured to generate at least a first reference resistance from resistances of a plurality of reference cells; a sense circuit formed in the substrate coupled to the memory cells and at least the first reference resistance and configured to compare a resistance of a selected memory cell to at least the first reference resistance to determine the data stored by the selected memory cell.

11 Claims, 11 Drawing Sheets

(56) References Cited

U.S. PATENT DOCUMENTS

| | | | |
|---|---|---|---|
| 8,913,444 B1 | 12/2014 | Gilbert et al. | |
| 9,099,175 B1 | 8/2015 | Hollmer et al. | |
| 9,613,693 B1 | 4/2017 | Kamalanathan | |
| 9,721,658 B1 | 8/2017 | Hollmer et al. | |
| 2010/0118581 A1* | 5/2010 | Okayama | G11C 5/025 |
| | | | 365/51 |
| 2013/0265820 A1* | 10/2013 | Chih | G11C 11/1673 |
| | | | 365/158 |
| 2015/0092469 A1* | 4/2015 | Kim | G11C 7/14 |
| | | | 365/148 |
| 2015/0138877 A1* | 5/2015 | Nebashi | H03K 19/18 |
| | | | 365/158 |

\* cited by examiner

|Rcell - Rprog_ref| < |Rcell - Rerase_ref| → Cell = PROG
|Rcell - Rprog_ref| > |Rcell - Rerase_ref| → Cell = ERASE

FIG. 11A

Rcell < Rprog_ref → Cell = PROG
Rcell - Rprog_ref < Rerase_ref - Rcell → Cell = PROG
Rcell - Rprog_ref > Rerase_ref - Rcell → Cell = ERASE
Rcell > Rerase_ref → Cell = ERASE

FIG. 19A
(BACKGROUND)

FIG. 19B
(BACKGROUND)

FIG. 20A
(BACKGROUND)

FIG. 20B
(BACKGROUND)

REFERENCE CIRCUITS AND METHODS FOR RESISTIVE MEMORIES

This application claims the benefit of U.S. Provisional Patent Application Ser. No. 62/531,488, filed Jul. 12, 2017, the contents of which are incorporated by reference herein.

TECHNICAL FIELD

The present disclosure relates generally to memory devices having programmable resistance elements, and more particularly circuits and methods for generating reference resistance values used to determine data values stored by resistance elements.

BACKGROUND

Resistive memory devices enjoy continued popularity due to their low power consumption, nonvolatile storage capabilities, and ease of integration into existing fabrication processes. Conventional resistive memory devices store data in a memory cell by programming one or more resistive elements. Typically, resistive elements can be set (programmed) to a lower resistance or reset (erased) to a high resistance. A data value stored by a memory cell can be determined according to a difference in resistance between the memory cell and a fixed reference resistance.

A challenge presented by conventional resistive memory devices is cell resistance drift. Due to various factors, including but not limited to use (program and/or erase cycles), temperature cycles, or even the passage of time, resistance values can change. As a result, a difference in resistance between the reference resistance and some memory cells can grow smaller, leading to errors in sensing data.

Figure 19A:
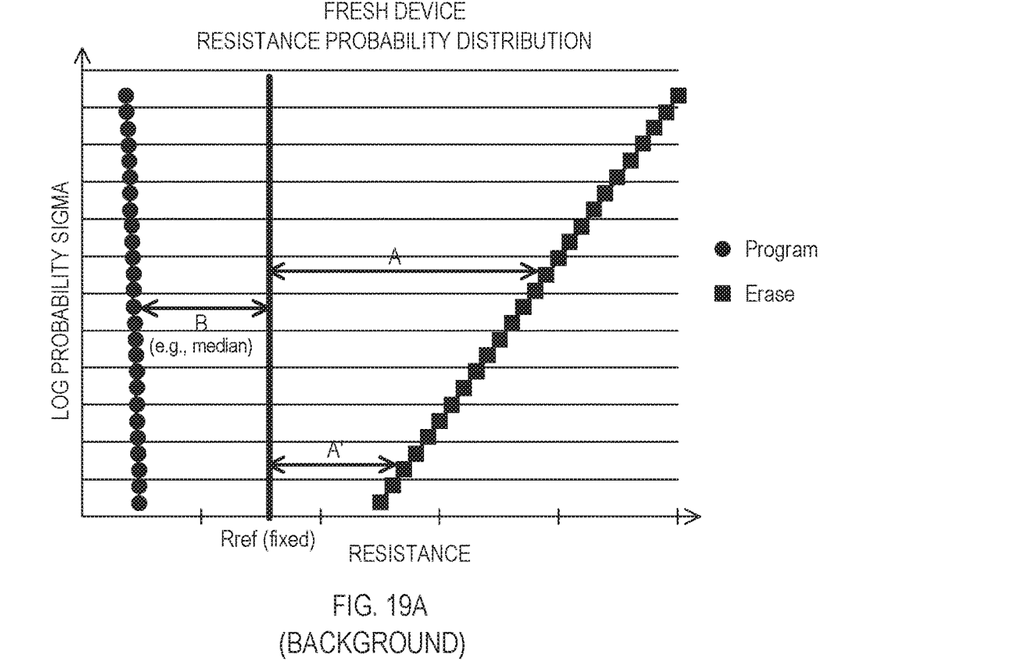
FIGS. 19A and 19B are diagrams showing conventional single ended fixed reference sensing for resistive memories.
Figure 19B:
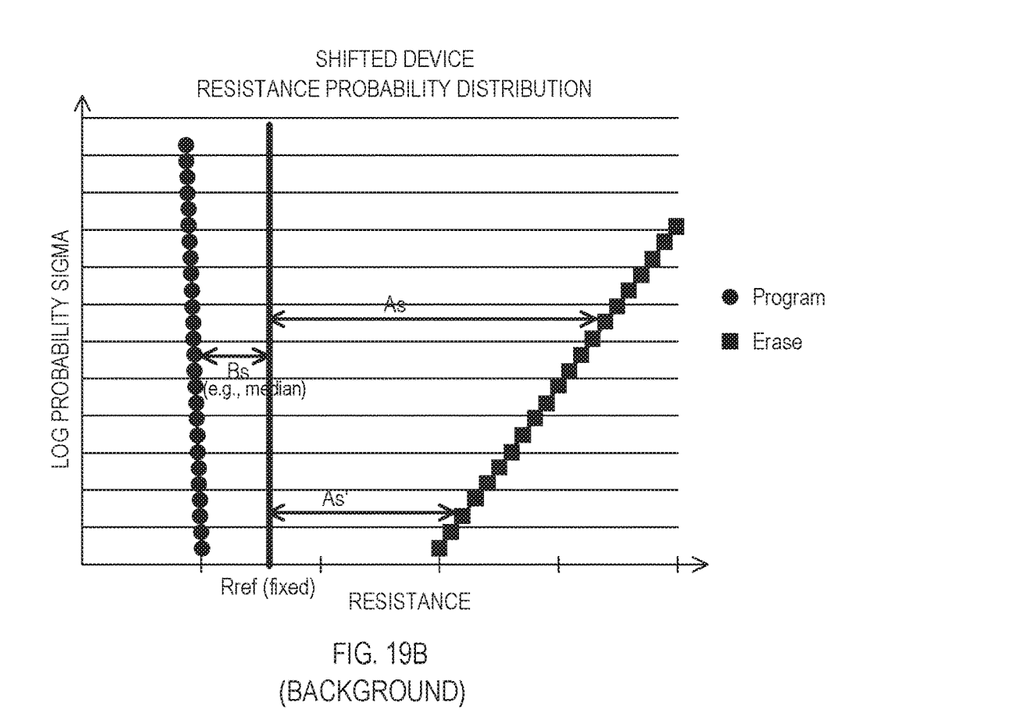

FIGS. 19A and 19B are diagrams showing conventional data sensing (e.g., read) operations for a resistive memory device. FIGS. 19A and 19B show a sigma probability distribution for the resistance of memory cells in programmed states (Program) and erased states (Erase). FIG. 19A shows resistance distributions for a "fresh" memory device. A fresh memory device can be a memory device that has been subject to no, or very little, programming (e.g., cycles). FIG. 19A also shows a fixed reference resistance Rref. FIG. 19A shows various sensing "windows" corresponding to a difference between the resistance of a memory cell and Rref. Window A shows a sensing window for a typical (i.e., median) erased cell. Window A' shows a sensing window for an erased cell at the lower resistance end of the distribution (e.g., tail bit). Window B shows a sensing window for a typical programmed cell.

FIG. 19B shows shifted resistance distributions for the memory device. Such a shifting can result from various factors, including but not limited to those noted above. As shown, memory cells in both the programmed state (Program) and erased state (Erase) have shifted in a more resistive direction. Consequently, while sensing windows for erased cells (e.g., As and As') have grown larger, the sense window for programmed cells (e.g., Bs) has decreased. As a result, sense (read) operations to programmed memory cells, especially those at the higher resistance end of the distribution, may erroneously determine the cell is erased instead of programmed.

A conventional approach to ensuring wide sensing windows for a resistive memory device is to use a differential sensing scheme. In a conventional differential sensing scheme, a data bit is stored using two resistive elements programmed to opposite states instead of one resistive element programmed to one state or another. Accordingly, a sense window is presented by the difference in resistance between the two states. That is, if a first resistive element has greater resistance than a second resistive element, the bit is determined to have one value (e.g., a zero). Conversely, if the second resistive element has greater resistance than the first resistive element, the bit is determined to have the other value (e.g., a one). Differential sensing schemes can utilize memory cells with two resistive elements to store one bit, or two separate memory cells each with one resistive element to store one bit.

Figure 20A:
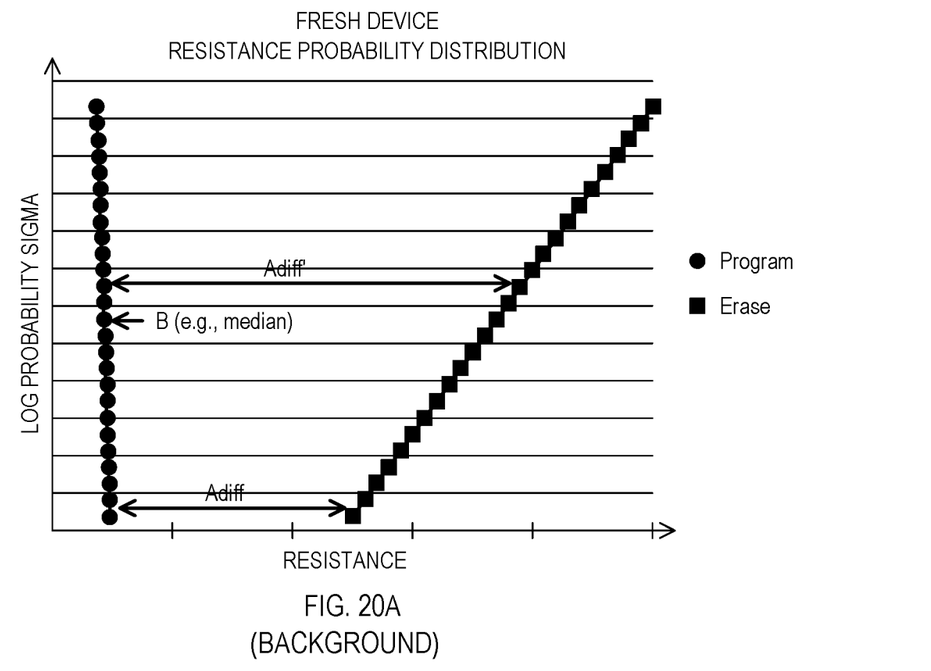
FIGS. 20A and 20B are diagrams showing conventional two-cell differential sensing for resistive memories.
Figure 20B:
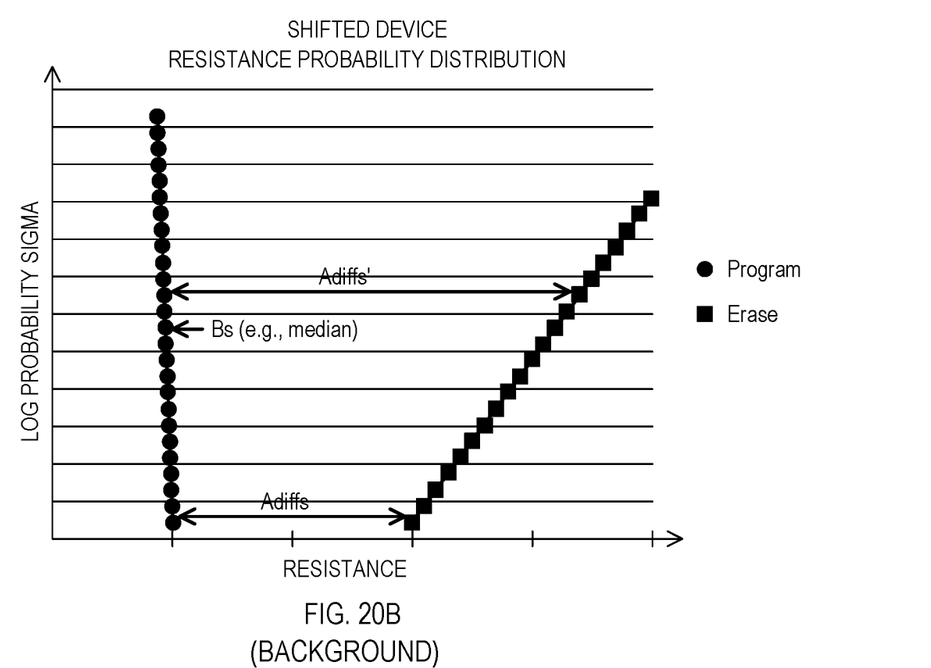

FIGS. 20A and 20B are diagrams like FIGS. 19A and 19B, however, instead of showing sensing windows relative to a fixed reference resistance, differential sensing windows are shown. FIG. 20A shows a nominal sensing window Adiff (e.g., resistive element having a median Program resistance and a resistive element having a median Erase resistance). FIG. 20A also shows a "worst case" sensing window Adiff (e.g., high Program resistance with low Erase resistance). FIG. 20B shows the same sensing windows with shifted resistance values. As shown, both a nominal sensing window Adiffs' and a worst case sensing window Adiffs remain relatively large.

A drawback to conventional differential sensing schemes can be the high cost in area. Because two programmable resistive elements are needed for each data bit, double the area may be needed as compared to single element memory cells.

DETAILED DESCRIPTION

Embodiments described herein can include memory devices, circuits and methods for generating a reference resistance to compare against a memory cell resistance, having a greater sensing window than conventional approaches, like those shown in FIGS. 19A and 19B.

In some embodiments, one or more reference resistances can be generated from multiple reference cells, where the reference cells each include a programmable resistance like that in memory cells for storing data. In other embodiments, a reference resistance can include two or more portions. One portion can be a resistance that varies according to one or more states of the memory device, including but not limited to: a number of memory cell accesses (e.g., cycles) or a temperature history of the memory device, as but two examples.

Embodiments can include comparing a cell resistance to at least two reference bits (values generated from reference cells). The comparison can be to reference bits set to different values (e.g., one reference cell programmed to a low resistance, one reference cell erased to a high resistance), or reference bits set to a same value (e.g., an average or median of multiple reference bits set to the same value, with or without some adjustment or offset).

According to some embodiments, reference cells can be associated with a group of memory cells that store data. The reference cells can be cycled (e.g., re-programmed, erased) in some relation to their associated memory cells being programmed and/or erased. Thus, reference cells (i.e., reference bits) can have a same, similar, or otherwise equivalent "history" (e.g., number of cycles and age) as their associated memory cells (e.g., sensed bits).

In the various figures shown below, like items are referred to with the same reference numerals but with the leading digit(s) corresponding to the figure number.

Figure 1A:
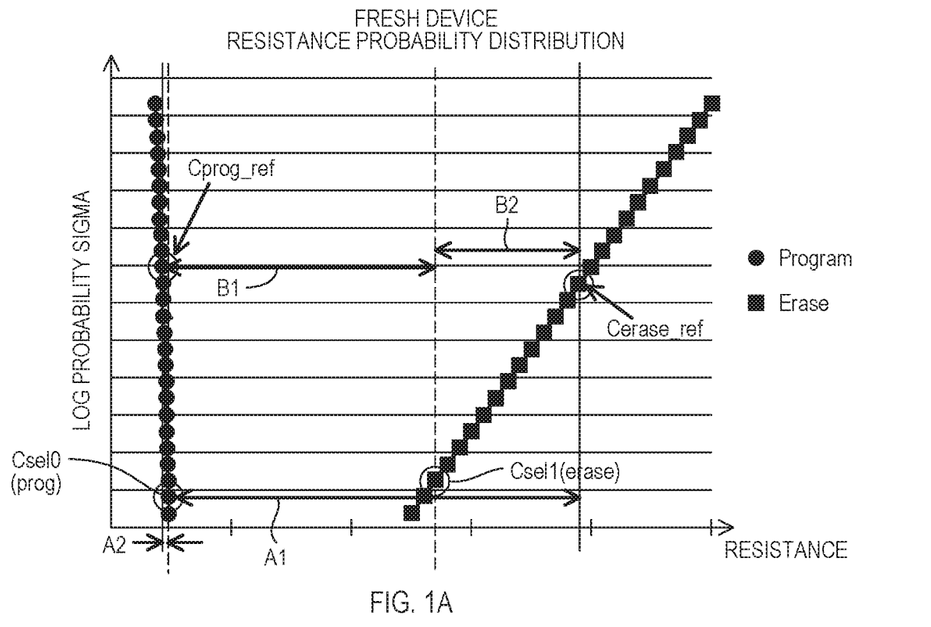
FIGS. 1A and 1B are diagrams showing a differential sensing method according to one embodiment.
Figure 1B:
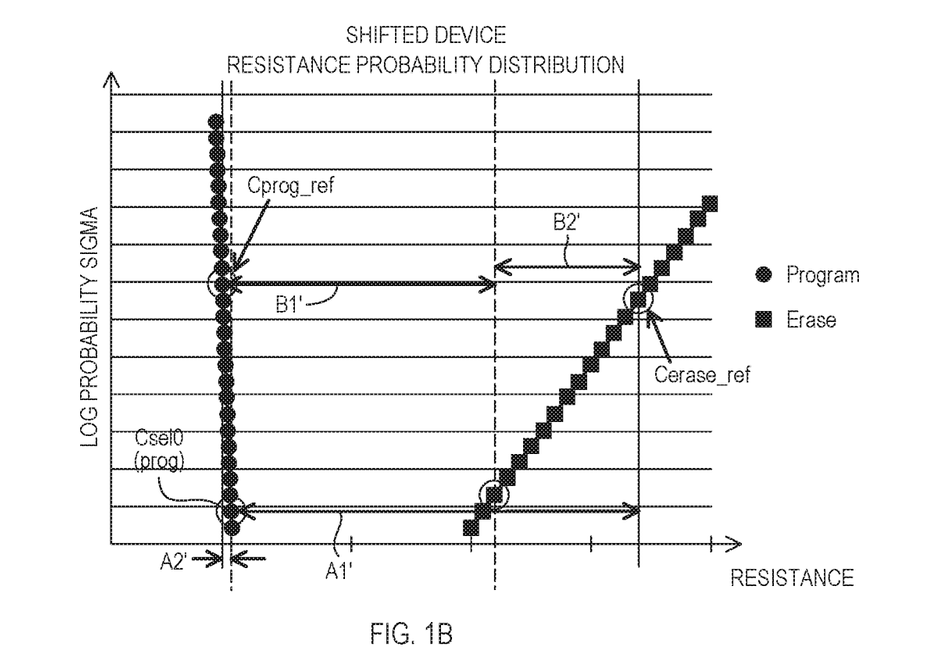

FIGS. 1A and 1B are diagrams showing sensing methods according to an embodiment. FIGS. 1A and 1B show a sigma probability distribution for the resistance of memory cells in lower resistance programmed states (Program) and higher resistance erased states (Erase). FIG. 1A shows resistance distributions for a "fresh" memory device. FIG. 1B shows resistance distributions for the memory device after they have shifted, which can result from various factors, including but not limited to those noted herein.

FIGS. 1A and 1B show a sensing method which utilizes one reference cell programmed to the program state (Cprog_ref) and one reference cell programmed to the erase state (Cerase_ref). FIGS. 1A and 1B also show sense windows with respect to a selected memory cell that is in a programmed state Csel0(prog), as well as to a selected memory cell in the erased state Csel1(erase).

A sense operation can determine a difference in resistance between a selected memory cell (e.g., Csel0, Csel1) and both reference cells (Cprog_ref, Cerase_ref). A smaller of the differences can indicate the state of the memory cell. That is, if a memory cell resistance is closest to Cprog_ref, it can be in the programmed state, and if a memory cell resistance is closest to Cerase_ref, it can be in an erased state.

Referring to FIG. 1A, a difference in resistance between programmed memory cell Csel0(prog) and erased reference cell Cerase_ref is shown as A1. A difference in resistance between programmed memory cell Csel0(prog) and programmed reference cell Cprog_ref is shown as A2. A sense window can thus be conceptualized as a difference between A1 and A2. Because A2 is smaller than A1, Csel0 can be determined to be programmed.

Similarly, a difference in resistance between erased memory cell Csel(erase) and erased reference cell Cerase_ref is shown as B2. A difference in resistance between erased memory cell Csel0(erase) and programmed reference cell Cprog_ref is shown as B1. A sense window can thus be conceptualized as a difference between B2 and B1. Because B2 is smaller than B1, Csel0 can be determined to be erased.

It is understood that in some embodiments, a Cprog_ref and Cerase_ref can fall anywhere in their respectively distributions but are most likely to be in the middle of the distribution.

FIG. 1B shows the same resistance differences after the resistance values have shifted. Thus, for the case of Csel0(prog), a sense window can be the difference between A1' and A2', while the sense window for Csel1(erase) can be the difference between B2' and B1'. Thus, relatively large sense windows can be maintained even though resistance values have shifted.

Figure 2A:
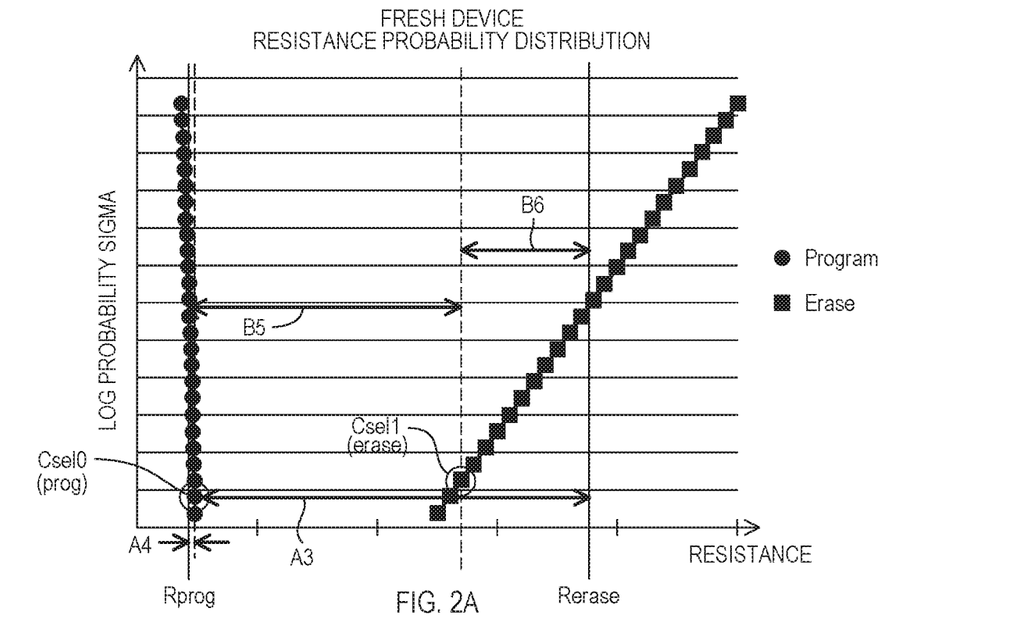
FIGS. 2A and 2B are diagrams showing a differential sensing method according to another embodiment.
Figure 2B:
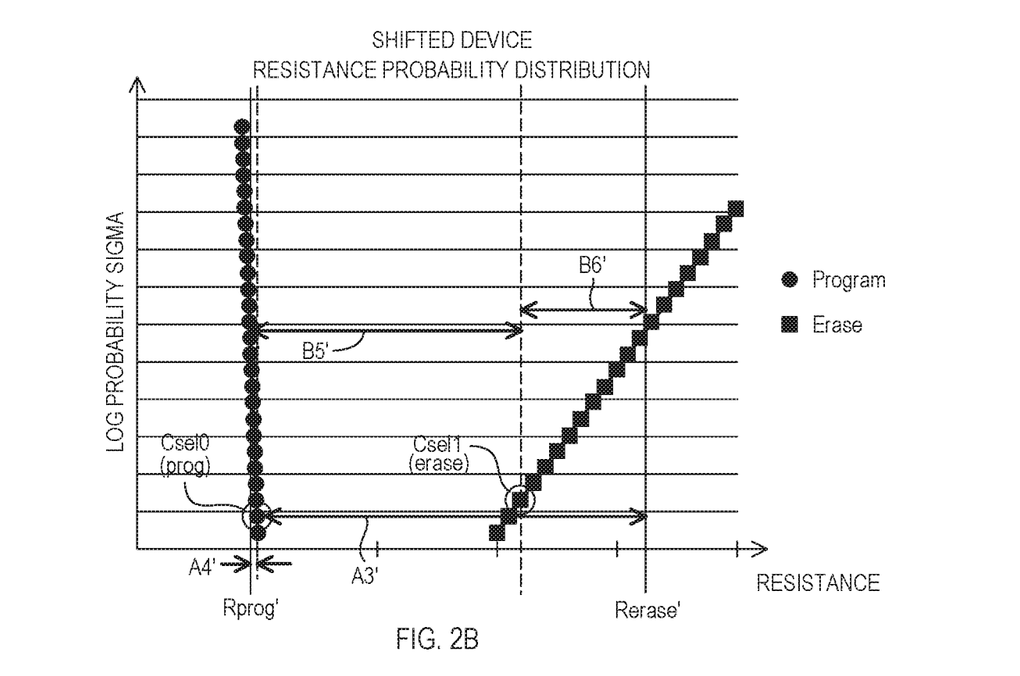

FIGS. 2A and 2B are diagrams showing sensing methods according to another embodiment. FIGS. 2A and 2B show probability distributions and resistance as in the case of FIGS. 1A and 1B. FIGS. 2A and 2B show a sensing method which utilizes multiple reference cells to arrive at a program reference resistance (Rprog, Rprog') and an erase reference resistance (Rerase, Rerase'). As but two of many possible examples, a program reference resistance can be arrived at by averaging or taking a median of the resistances of multiple reference cells set to the program state. Similarly, an erase reference resistance can be arrived at by averaging or taking a median of the resistances of multiple reference cells reset to the erase state. However, any other suitable method can be used to generate a reference resistance from multiple reference cells. For example, outliers can be discarded (e.g., reference resistances of greatest variance from others can be discarded; or for programmed reference cells, higher resistances can be discarded and/or for erased reference cells, lower resistance can be discarded). Outliers may also be selected (a lowest programmed reference cell is used for Rprog/Rprog' and a highest erased reference cell can be used for Rerase/Rerase'). Still further, as will be described for other embodiments herein, an offset resistance can be added or subtracted from a resistance generated with multiple reference cells to arrive at a reference resistance.

A sense operation can determine a difference in resistance between a selected memory cell (e.g., Cse10, Csel1) and both reference resistances.

Sense windows for the memory cells of FIGS. 2A and 2B are understood from the discussion of FIGS. 1A and 1B. In FIG. 2A, for the fresh memory device, using reference resistances Rprog and Rerase (which are both generated from multiple memory cells), a sense window for Csel0(prog) can be a difference between A3 and A4, while a sense window for Csel(erase) can be a difference between B6 and B5. Because A4<A3, Csel0(prog) can be considered programmed. Because B6<B5, Csel1(erase) can be considered erased.

In FIG. 2B, after resistances have shifted, using reference resistances Rprog' and Rerase' (which have shifted in accordance with their reference cells), a sense window for Csel0 (prog) can be a difference between A3' and A4', while a sense window for Csel(erase) can be a difference between B6' and B5'. Accordingly, in this embodiment, sense windows can be maintained even though resistance values have shifted.

Figure 3A:
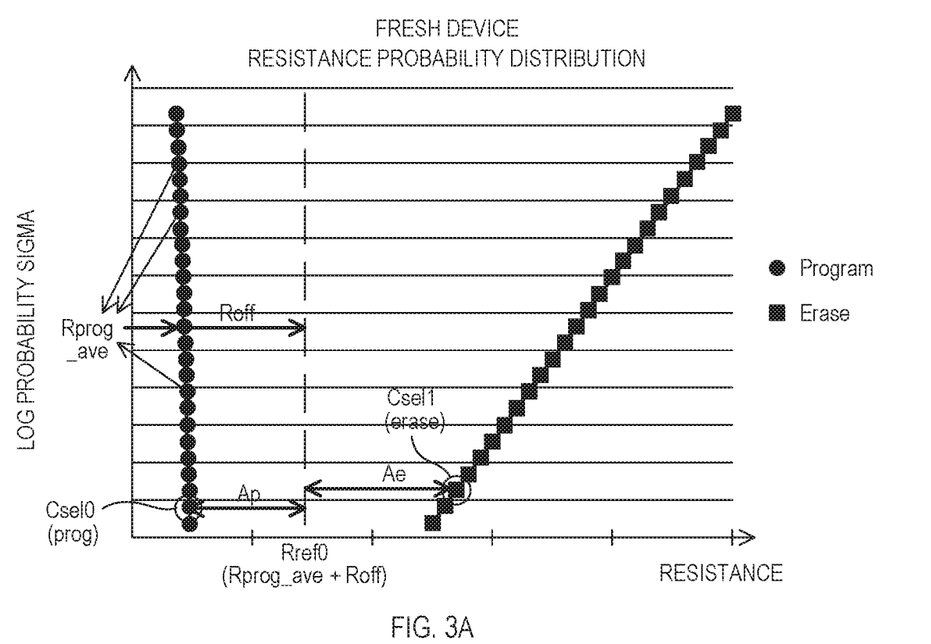
FIGS. 3A and 3B are diagrams showing a single ended sensing method according to another embodiment.
Figure 3B:
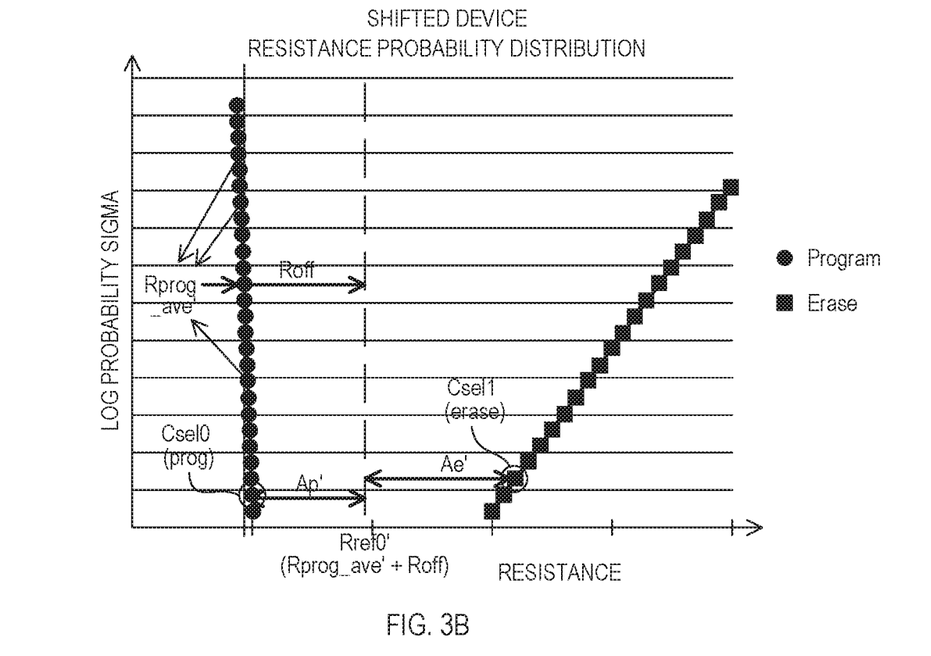

FIGS. 3A and 3B are diagrams showing sensing methods according to a further embodiment. FIGS. 3A and 3B show probability distributions and resistance as in the case of FIGS. 1A and 1B. However, FIGS. 3A and 3B show a single ended sensing scheme where memory cells are compared to one reference resistance. A reference resistance can include a first part, generated from multiple reference cells, and a second part that is an offset resistance. A first part can be arrived at with multiple reference cells according to any of the approaches described herein, or equivalents. FIGS. 3A and 3B show a reference resistance having a first part generated by taking an average of three reference cells set to the programmed state (Rprog_ave). In the embodiment shown, the offset resistance Roff can be a fixed resistance.

A sense operation can compare a resistance of a selected memory cell (e.g., Csel0, Csel1) to the reference resistance.

Referring to FIG. 3A, a sense window for memory cell Csel0(prog) is shown as Ap and can be the difference between its resistance and the reference resistance Rref0. A sense window for memory cell Csel1(erase) is shown as Ae and can be the difference between its resistance and the reference resistance Rref0.

Referring to FIG. 3B, due to a shift in resistance values, a reference value has also shifted to Rref0'. A sense window for memory cell Csel0(prog) is shown as Ap', and sense window for memory cell Csel1(erase) is shown as Ae'. Thus, while resistance values have shifted, sense windows are not adversely affected.

While FIGS. 3A/B show a reference resistance generated by adding an offset voltage to a resistance generated from multiple programmed reference cells, other embodiments can include a reference generated by subtracting an offset resistance (i.e., by placing another resistance in parallel) from a resistance generated from multiple erased reference cells.

According to embodiments, reference cells can be associated with a group of memory cells. A group of memory cells can be any suitable number, including all of the memory cells of an integrated circuit device (e.g., chip), or some other physical or logical division, such as per bank, per page, per sector, per word line, per word, or per byte, as but a few examples. Various embodiments of reference cells and their associated memory cells will now be described.

Figure 4:
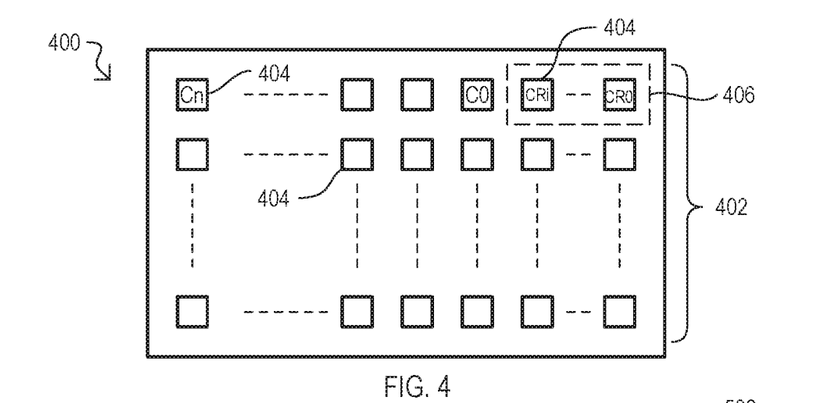
FIG. 4 is a block diagram of a memory device having global reference cells according to an embodiment.

FIG. 4 shows a memory device 400 that can include one or more arrays 402 of cells, three of which are shown as 404. Cells 404 can include memory cells, some shown as Cn to C0, and reference cells 406. Memory cells (e.g., Cn to C0) can store data received by the memory device 404, which can be subsequently read out from the memory device 404 using one or more reference resistances generated from reference cells 406. As but a few of many possible examples, in a scheme like that of FIGS. 1A/B, one of the reference cells 406 can be set to a programmed state, while another of the reference cells 406 can be reset to an erased state. In a scheme like that of FIGS. 2A/B, one group of reference cells from 406 can be set to a programmed state, and such cells can be used to generate a reference voltage Rprog. Another group of reference cells from 406 can be reset to an erase state and used to generate a reference voltage Rerase. In a scheme like that of FIGS. 3A/B, reference cells 406 can be programmed to a same state (e.g., program or erase) and used to form one portion of a reference voltage, to which an offset resistance can be added or subtracted.

While reference cells 406 can be used to generate a reference voltage for the memory cells of array 402, reference cells could also be used to generate a reference voltage for other arrays (not shown) of a memory device 400. While reference cells 406 are shown in one particular region of array 402 (i.e., corner), it is understood that reference cells 406 can be located in any portion of array 402. Further, reference cells 406 need not be a contiguous set of cells. That is, a reference cell could be surrounded by memory cells.

According to embodiments, reference cells (e.g., 406) can be fabricated in the same fashion as memory cells (e.g., Cn to C0), thus as resistances in memory cells drifts, so can the resistance of reference cells 406. However, in other embodiments, reference cells 406 can differ from memory cells (e.g., Cn to C0). As but one example, reference cells (e.g., 406) could include additional resistance values to offset their programmed values.

Figure 5:
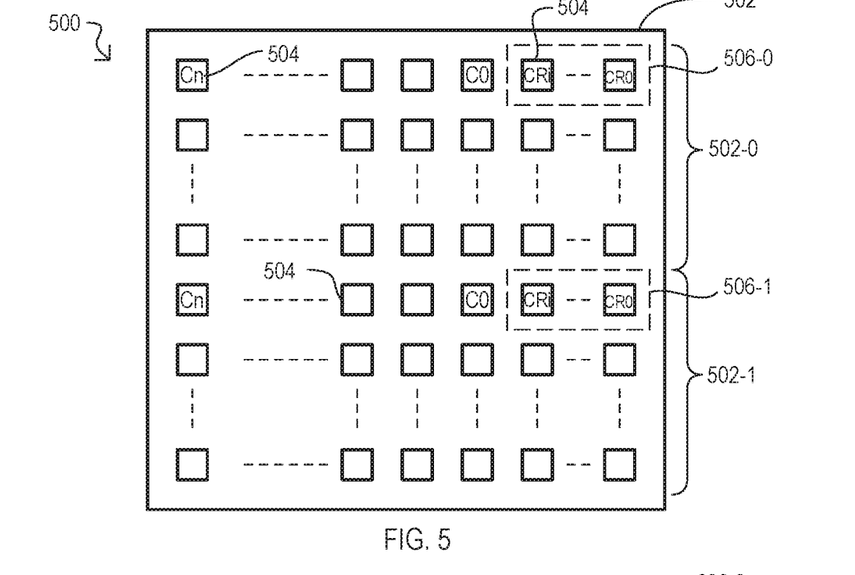
FIG. 5 is a block diagram of a memory device having reference cells for designated sections according to an embodiment.

FIG. 5 shows a memory device 500 according to another embodiment. FIG. 5 shows an arrangement like that of FIG. 4, including an array 502 with cells 504, including memory cells (e.g., Cn to C0) and reference cells 506-0/1. However, unlike FIG. 4, an array 502 can be divided into multiple sections 502-0/1, each including its own set of reference cells 506-0/1. Each set of reference cells 506-0/1 can be cycled (e.g., erased and/or programmed) in some relation to the memory cells of its section 502-0/1. Thus, reference cells 506-0 can have a same or similar history (e.g., use or wear) as the memory cells of their section 502-0, and reference cells 506-1 can have the same or similar history as the memory cells of their section 502-1.

As in the case of FIG. 4, reference cells 506-0/1 could be located at any position within their corresponding section 502-0/1, and need not be contiguous (i.e., adjacent to one another).

Figure 6:
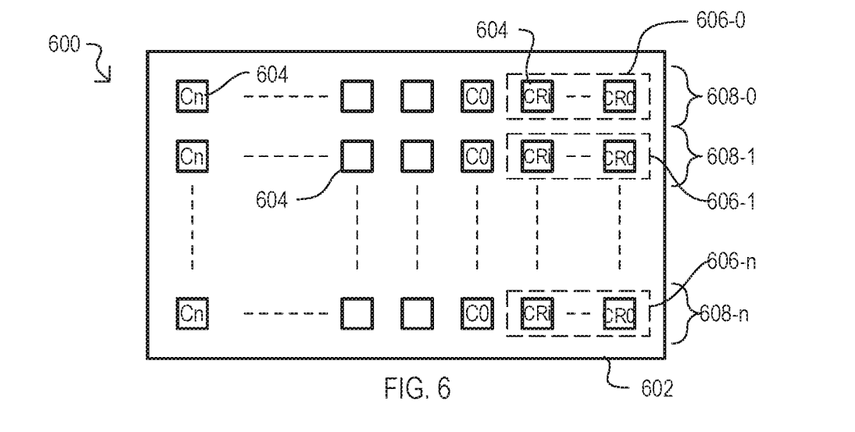
FIG. 6 is a block diagram of a memory device having reference cells for each row of a memory device according to an embodiment.

FIG. 6 shows a memory device 600 according to a further embodiment. FIG. 6 shows an arrangement like that of FIG. 5, including an array 602 with cells 604, including memory cells (e.g., Cn to C0) and reference cells 606-0 to -n. However, in FIG. 6, cells (e.g., 604) are physically arranged into rows 608-0 to -n, with each row having a corresponding set of reference cells 606-0 to -n. Accordingly, when data are sensed from memory cells (e.g., Cn to C0) of a given row 608-0 to -n, reference resistances for the sense operation can be generated from the reference cells 606-0 to -n of that row 608-0 to -n.

In some embodiments, reference cells 606-0 to -n can be cycled according to the use of the memory cells of their row 608-0 to -n. Thus, reference cells 606-0 to -n can have a same or similar history as the memory cells of their row 608-0 to -n.

Figure 7:
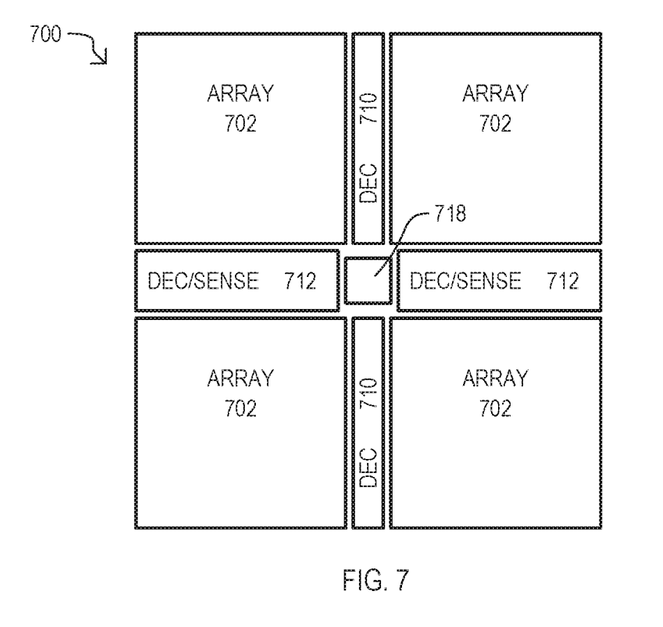
FIG. 7 is a block diagram of a memory device according to various embodiments, including an embodiment in which reference cells are not part of an array.

While embodiments can include reference cells formed as part of a larger array that includes memory cells, other embodiments can form reference cells separate from memory cell arrays. FIG. 7 shows one example of such an embodiment.

FIG. 7 shows a memory device 702 that includes a number of arrays 702, decode sections 710, decode and sense sections 712, and reference circuit 718. Arrays 702 can include memory cells for storing data in the memory device 700 for subsequent read out. Decode sections 710 can select a portion of an array (e.g., row) for access. Decode and sense sections 712 can select another portion of an array (e.g., columns) for access, and sense the data stored in memory cells by comparing a memory cell resistance to one or more reference resistances. Reference circuit 718 can provide one or more reference resistances to sense and decode sections 712 to enable readout of data from memory cells of array 702.

In some embodiments, reference circuit 718 can include reference cells as described herein, as well as circuits for generating one or more reference resistances from the reference cells. Thus, reference cells are not formed in an array 702. However, in other embodiments, a reference circuit 718 can generate a reference resistance in other ways as described herein, or equivalents (e.g., fixed portion with variable portion added or subtracted).

It is understood that a "reference resistance" and a comparison of memory cell resistance to a reference resistance as described herein can include voltages and/or currents generated from such resistances. As but one example, circuits that sense memory cell data values can receive voltages and/or currents representing a resistance of a selected memory cell and reference resistance(s).

Figure 8:
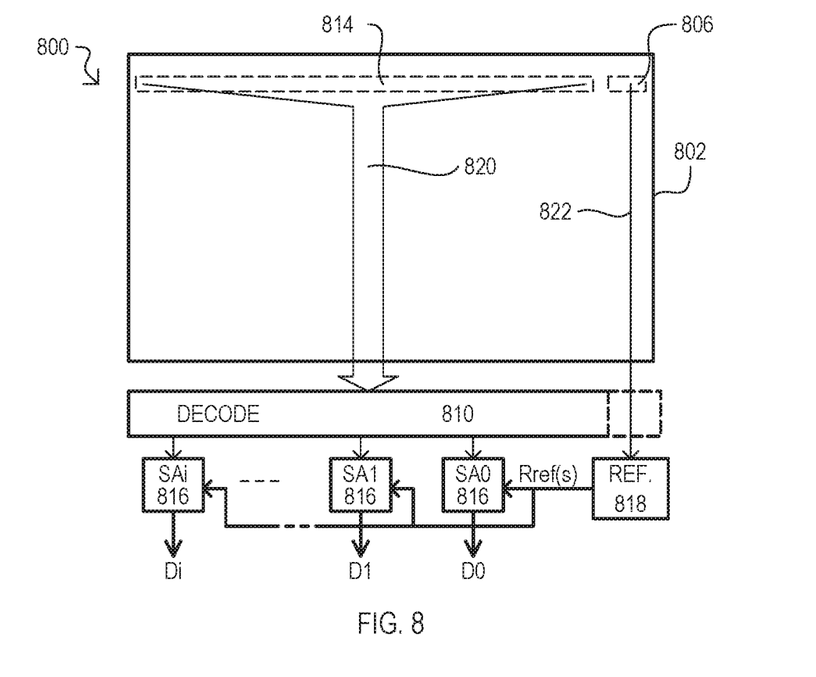
FIG. 8 is a block diagram of a memory device showing sense operations according embodiments.

FIG. 8 is a block schematic diagram of a memory device 800 according to another embodiment. A memory device 800 can include an array 802, a decode section 810, sense circuits 816, and reference circuit 818. An array 802 can include memory cells for storing data for readout from the memory device 800, and the memory cells can be accessible in groups (one shown as 814). In the embodiment shown, array 802 can include reference cells 806. Reference cells 806 can take the form of any of those described herein, or equivalents.

A decode section 810 can be connected to a memory cell group 814 by a read operation 820, which can involve the operation of other decoder circuits (not shown) operating in response to command and address data received by memory device 800. Based on received values (e.g., address values), decode section 810 can select memory cells from an accessed group 814 for sensing by sense circuits 816. Sense circuits 816 can determine a data value stored by a memory cell by sensing a difference between resistance values of selected memory cells and one or more reference resistances received from reference circuit 818. Sensed data values can be provided as output data Di to DO.

In the embodiment shown, a reference circuit 818 can be connected to reference cells 806 (a connection path shown as 822), and from such reference cells 806 generate one or more reference resistances as described herein. In some embodiments, certain reference cells from reference cells 806 can be selected by decode section 810, or some other decoding circuit.

In some embodiments, a reference circuit 818 can be connected to reference cells 806 at essentially the same time memory cells are connected to sense circuits 816. However, in other embodiments, a reference circuit 818 can be connected to reference cells 806 prior to a sense (read) operation by sense circuits 816, and thus determine reference resistance(s) before sensing of data occurs.

While FIG. 8 shows an embodiment where reference circuit 818 can be connected to, and generate one or more reference resistances from, reference cells 806, in other embodiments, reference circuit 818 can generate reference resistance(s) from reference cells local to reference circuit 818, or in ways that do not involve reference cells, as described herein, or equivalents.

As noted above, a reference resistance (Rref) can be generated by averaging resistance values of multiple reference cells. That is, if resistances of references cells are given as Rrefx, where x denotes the reference cells used, a reference resistance can be:

$$Rref=(R_{ref0}+R_{ref1}+\ldots R_{refn})/(n+1)(n>1)$$

In some embodiments, a reference resistance can be a program reference resistance (Rref(prog)) generated from reference cells programmed to a low (e.g. program) resistance. If resistances of references cells in a low resistance state are given as $R_{cpx}$, a reference resistance can be:

$$Rref(prog)=(R_{cp0}+R_{cp1}+\ldots R_{cpn})/(n+1)(n>1)$$

In addition or alternatively, a reference resistance can be an erase reference resistance (Rref(erase)) generated from reference cells programmed to a high (e.g. erase) resistance. If resistances of references cell in a high resistance state are given as $R_{cex}$, such a reference resistance can be:

$$Rref(erase)=(R_{ce0}+R_{ce1}+\ldots R_{cen})/(n+1)(n>1).$$

Figure 9:
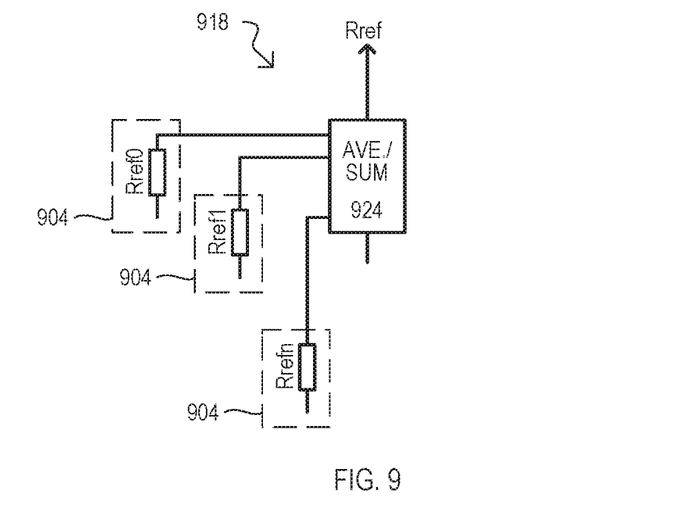
FIG. 9 is a block diagram of a reference circuit that can be included in embodiments.

FIG. 9 shows one example of a reference circuit 918 that can be included in embodiments. A reference circuit 918 can receive reference resistances Rref0 to Rrefn from reference cells 904. According to embodiments, such reference cells 904 can all be programmed to a same state. An averaging or summing circuit 924 can generate a reference resistance Rref that is, or includes, an average of the received reference resistances (Rref0 to Rrefn).

In some embodiments, differential sensing can be used to determine data stored in a memory cell. Such differential sensing can include a memory cell resistance being compared to two different reference resistances. In particular embodiments, a memory cell resistance can be compared to a first reference resistance (e.g., Rprog_ref) corresponding to a low resistance state, and also to a second reference resistance (e.g., Rerase_ref) corresponding to a high resistance state. As understood from embodiments herein, a first and/or second resistance can correspond to a selected reference cell programmed to the desired state or can be generated from multiple reference cells programmed to the same state (e.g., an average, median, or outlier, with or without offset).

Figure 10:
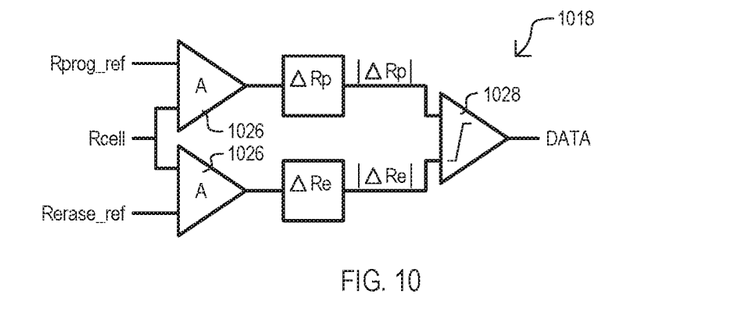
FIG. 10 is a block diagram of a differential sensing that can be included in embodiments.

FIG. 10 shows one example of a sense circuit 1018 that can be included in embodiments. A sense circuit 1018 can include sense amplifiers 1026 and a comparator 1028. A difference between the reference values (Rprog_ref, Rerase_ref) and a cell resistance Rcell can be generated (ΔRp, ΔRe). Based on the differences, comparator 1028 can determine the sensed a data value DATA. It is understood that differences (ΔRp, ΔRe) can be scaled differences (e.g., logarithmic).

Further, while FIG. 10 shows simultaneous sensing of ΔRp and ΔRe, in alternate embodiments a two step sensing method can be used. That is, one sense amplifier can initially generate one difference (e.g., ΔRp or ΔRe), which can be sampled/held, then the same sense amplifier can generate the other difference (ΔRe or ΔRp). The difference can then be compared to one another with a comparator or the like.

Figure 11A:
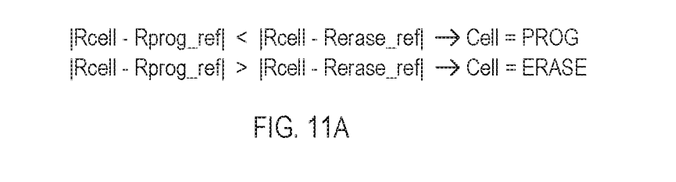
FIGS. 11A and 11B are diagrams showing sense operations according to embodiments.

FIG. 11A shows a differential sensing method as described. Depending upon a difference in resistance between a memory cell (Rcell) and two reference resistances (Rprog_ref and Rerase_ref), a cell can be determined to store one data value (PROG) or another (ERASE).

Figure 11B:
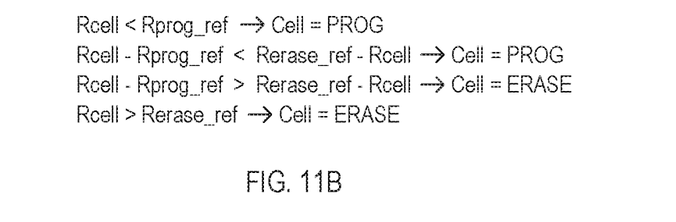

FIG. 11B shows an alternate differential sensing method. FIG. 11B is like that of FIG. 11A, however, two additional comparisons are made to eliminate the need for an absolute value determination. In particular, if a cell resistance Rcell is determined to be lower than a low reference resistance (Rprog_ref), the cell can be determined to store one value (PROG). If a cell resistance Rcell is determined to be greater than a high reference resistance (Rerase_ref), the cell can be determined to store another value (ERASE).

In some embodiments, a reference resistance can be generated by adding an offset to an averaged resistance of multiple reference cells programmed to a same state. If resistances of references cells are given as $R_{cx}$, and an offset resistance is Roffset, a reference resistance can be:

$$Rref=(R_{c0}+R_{c1}+\ldots R_{cn})/(n+1)+Roffset(n>1)$$

Figure 12:
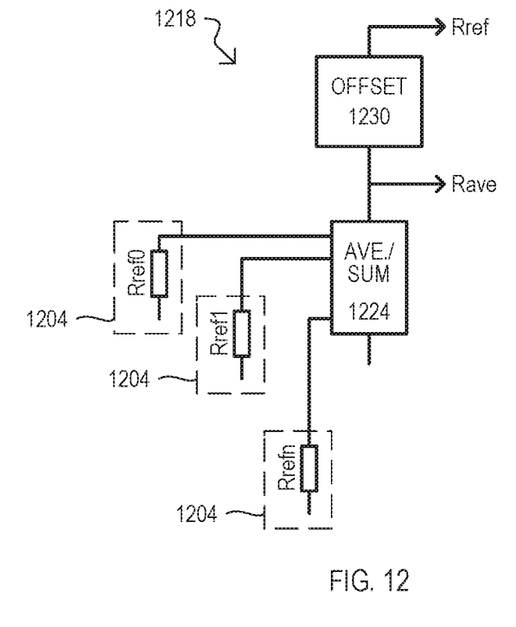
FIG. 12 is a block diagram of another reference circuit that can be included in embodiments.

FIG. 12 shows one example of a reference circuit 1218 that can generate such a reference voltage. Reference circuit 1218 can include items like those of FIG. 9. In addition, reference circuit 1218 can include an offset resistance 1230 in series with a resistance Rave generated by averaging/summing circuit 1224. In some embodiments, an offset resistance 1230 can be a fixed resistance. However, in other embodiments, offset resistance 1230 can vary according to various factors as described herein (e.g., history, temperature).

Figure 13:
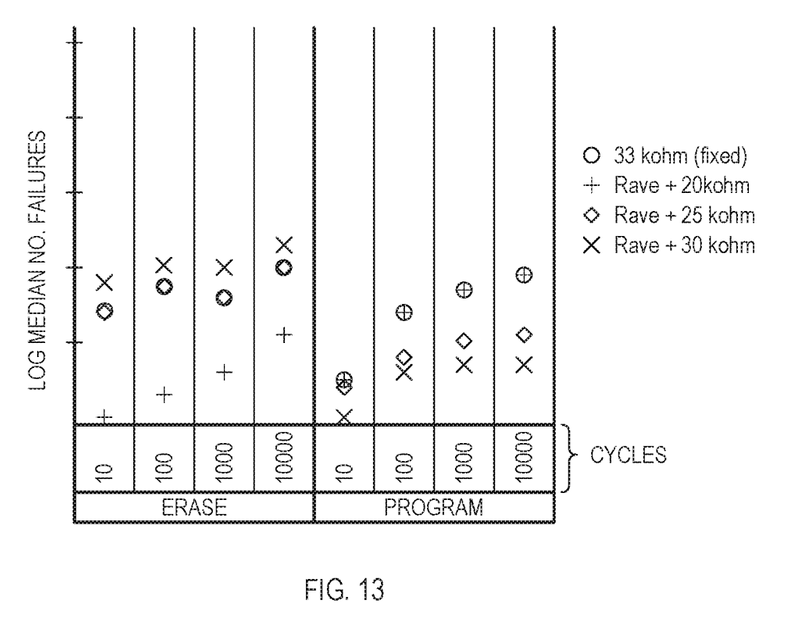
FIG. 13 is a diagram comparing conventional fixed reference sensing to sensing according to embodiments.

FIG. 13 show experimental results that compare conventional sensing methods to those according to embodiments. FIG. 13 shows a log median number of failures (i.e., wrong bit sensed) for memory cells programmed to different states after various numbers of cycles. Memory cells programmed to a high resistance state ERASE and low resistance state PROG were sensed after 10 cycles, 100 cycles, 1000 cycles and 10000 cycles. Conventional sensing was performed using a fixed resistance (33 kohm). Sensing according to embodiments was performed using an average of three different reference cells (i.e., bits) set to the programmed state (Rave), with various offset resistances (20 kohm, 25 kohm, and 30 kohm).

As shown, using a reference resistance of Rave+25 kohm reduced PROG failures with a same ERASE bit error rate (BER) as the conventional case. Using a reference resistance of Rave+20 kohm reduced ERASE failures without impacting PROG BER as compared to the conventional case.

It has been found that adding a fixed reference to an averaged resistance of as few as 3 reference cells can provide another 0.4 sigma improvement in BER at any operating point of tested memory devices.

Figure 14:
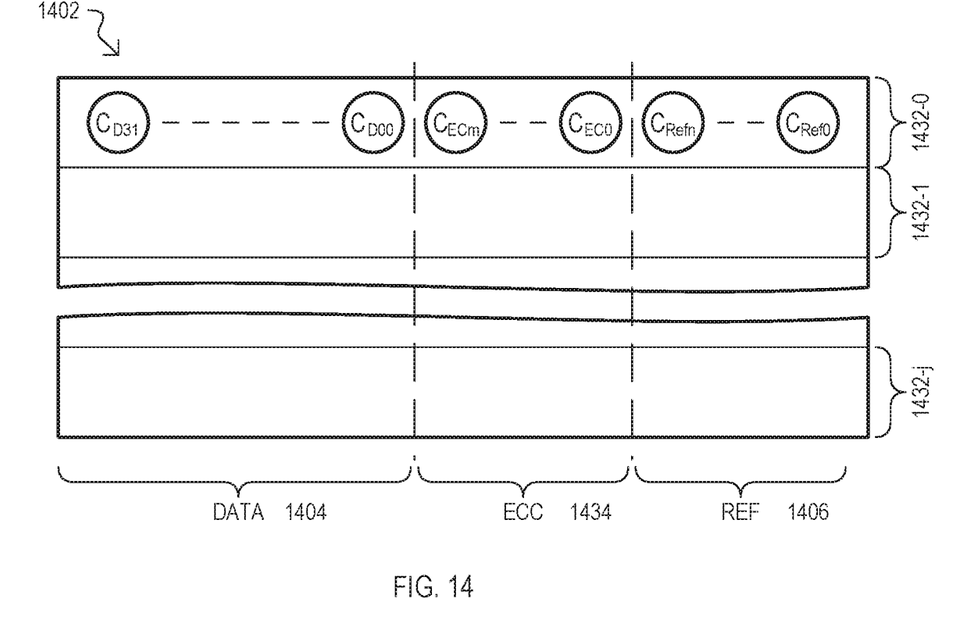
FIG. 14 is a diagram of an array according to one particular embodiment.

FIG. 14 shows an example of an array 1402 according to one embodiment. Array 1402 can include cells arranged in word groups 1432-0 to 1432-$j$. Each word group (1432-0 to 1432-$j$) can include a 32 bit data word (formed with memory cells $C_{D31}$ to $C_{D00}$) 1404, error correction code (ECC) bits (formed with ECC cells $C_{ECm}$ to $C_{EC0}$) 1434, and reference bits (formed with reference cells $C_{Refn}$ to $C_{Ref0}$). In some embodiments, there can be 7 ECC bits and four reference bits. Reference bits can be used to generate a reference resistance according to any of the embodiments described herein, or equivalents. When a data word 1404 is sensed (e.g., read) its corresponding reference bits 1406 can be used to generate at least part of a reference resistance used to determine the data values stored by the data word. An embodiment like that of FIG. 14 was used to generate the data shown in FIG. 13.

Figure 15:
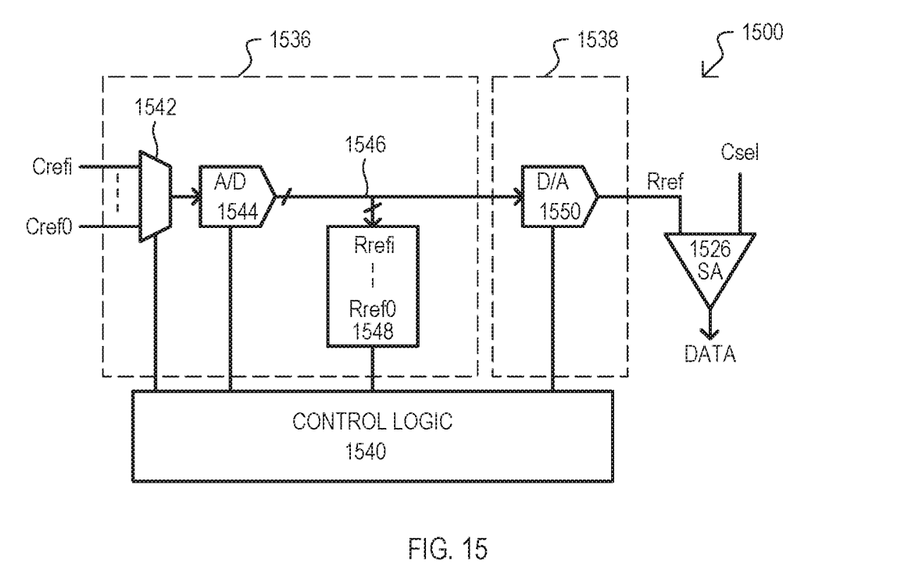
FIG. 15 is a diagram showing analog-to-digital conversion of reference resistance values that can be included in embodiments.

While reference resistance values can be generated by accessing reference cells during a sensing operation, reference resistance values can also be stored values. For example, reference resistance values can be digital values, derived from reference resistance values that are stored. The stored values can be recalled and then applied to a digital to analog converter (DAC) to generate the reference resistance value (as a voltage or current) for a sense operation. FIG. 15 shows one of many possible examples of such an approach.

FIG. 15 is a block schematic diagram of a memory device 1500 according to an embodiment. A memory device 1500 can include an analog-to-digital converter (ADC) section 1536, a DAC section 1538 and control logic 1540. An ADC section 1536 can receive resistance values from reference cells and convert them to digital values which can be stored for later use. In the embodiment shown, ADC section 1536 can include an input multiplexer (MUX) 1542, an ADC circuit 1544, and a store 1548. Input MUX 1542 can selectively apply each of a number of reference cells (Crefi to Cref0) to ADC 1544. ADC 1544 can convert a resistance of each reference cell (Crefi to Cref0), which can be received as a voltage or current, into a digital value onto output bus 1546. Such a digital value (Rrefi to Rref0) can then be saved in store 1548.

A DAC section 1538 can include a DAC circuit 1550 having an input coupled to bus 1546. A selected reference resistance (Rrefi_d to Rref0_$d$) stored as a digital value in store 1548 can be output on bus 1546 to DAC circuit 1550. DAC circuit 1550 can convert the digital value into an analog value Rref which can be received by a sense amplifier 1526 or the like. Sense amplifier 1526 can determine a data value stored in a memory cell Csel by comparing a resistance of the memory cell to the analog resistance value Rref. A DAC circuit 1550 can add/subtract an offset resistance when generating Rref.

Control logic 1540 can control various circuits of memory device 1500. In addition, control logic 1540 can select a digital reference resistance for application to DAC section 1538, as well as generate or alter digital reference resistance values. As but a few of many possible examples, control logic can access values within store 1548 to generate an average from such values, determine a median or outlier from a set of digital values, or add or subtract an offset to the digital values.

According to embodiments, reference cells can be "cycled" as memory (data storage) cells of a corresponding group are accessed. Thus, reference cells can have a "history" that follows the memory cells of their group. In this way, a reference resistance based on the reference cells can change with the resistances of the memory cells of its groups. Cycling can be according to any suitable manner. As but a few of many possible examples, reference cells can be cycled (set to their resistance states—e.g., programmed and/or erased) every other time memory cells of the group are accessed; different fractions of the reference cells can be cycled every cycle (e.g., ½ one cycle, the other ½ the next cycle); or reference cells can be set (e.g., written to) directly based on accesses to cells of the group.

In some embodiments, history values can be derived from sampling groups of memory cells made with a same manufacturing process. An anticipated response to history can then be stored in other memory devices and used to alter a reference value (e.g., generate an offset).

Figure 16A:
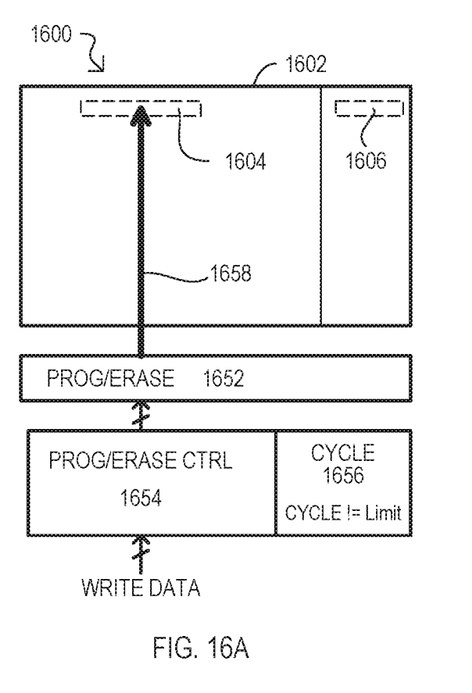
FIGS. 16A and 16B are diagrams showing a cycling of reference cells according to an embodiment.
Figure 16B:
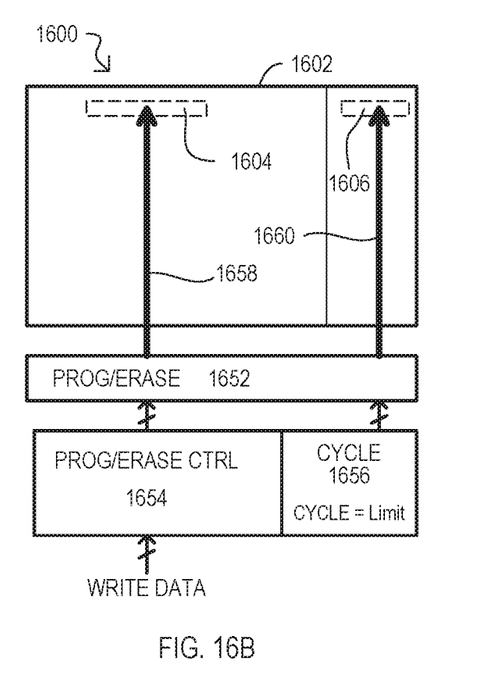

FIGS. 16A and 16B show a memory device 1600 according to embodiments. Memory device 1600 can include an array 1602, program and erase (P/E) circuits 1652, P/E control circuits 1654 and cycle recorder 1656. Array 1602 can include memory cells and reference cells, where reference cells are cycled based on a certain number of accesses to corresponding memory cells.

P/E circuits 1652 can apply electrical signals to accessed memory cells and reference cells to set the resistance values of such cells. P/E control circuits 1654 can control how electrical signals are applied to memory cells and reference cells. It is understood that a programming operation can establish resistance values for accessed memory cells 1604. Such programming can include placing memory cells in low or high resistance states according to write data. Programming of memory cells 1604 can take any suitable form. In some embodiments, programming can include the setting of both high and low resistance values to different memory cells based on write data at the same time. However, in other embodiments, such programming can include P/E circuits 1652 programming all memory cells of an accessed group to a same resistance state (e.g., all erased), then programming selected memory cells of the group to a second resistance state based on write data (selective program based on write data). Such programming can also include verify or similar operations that can repeatedly program a memory cell until it is within a desired resistance range.

Cycle recorder 1656 can track how many times data is written to selected groups of memory cells and how many times reference cells are cycled.

FIG. 16A shows a write (e.g., program) operation. Write data WRITE DATA can be received by memory device 1600. P/E control circuits 1654 can control P/E circuits 1652 to drive selected memory cells 1604 with electrical programming signals 1658. In addition, P/E control circuits 1654 can update a cycle number for the accessed memory cells 1604. Because the number of cycles to accessed memory cells has not reached some limit (CYCLE !=Limit), reference cells are not accessed.

FIG. 16B shows a subsequent write operation to that of FIG. 16A. The write operation of 16B differs from that of 16A in that the number of cycles to accessed memory cells 1604 has reached a limit (CYCLE=Limit). Consequently, reference cells 1606 are cycled (1660). In some embodiments this can include reprogramming reference cells with the states they are currently storing. However, in other embodiments this can include programming them to a state opposite that which they represent (e.g. programmed reference cells are erased, and erased reference cells are programmed), and then programming the reference cells back to their desired reference state.

In some embodiments, a reference resistance can be generated by adding a variable offset resistance to base resistance, where the base resistance can be fixed or variable. A variable offset resistance can change according a state of a memory device.

Figure 17:
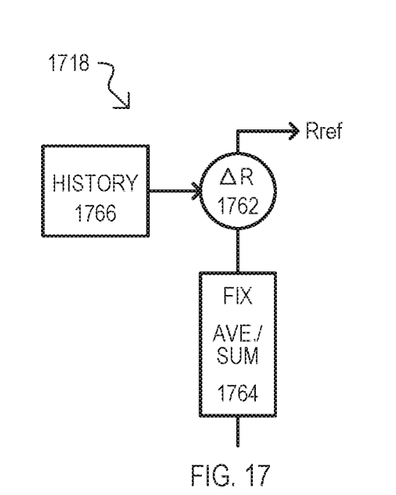
FIG. 17 is a diagram of a reference circuit according to another embodiment.

FIG. 17 shows a reference circuit 1718 that can be included in an embodiment. Reference circuit 1718 can provide a reference resistance Rref that includes a first resistance part 1764 and a second resistance part 1762. A first resistance part 1764 can be a fixed resistance or can be a resistance generated form multiple reference cells (e.g., an average, median or outlier) as described herein, or equivalents. A second resistance part 1762 can be a variable offset resistance that varies according to a history 1766 of a corresponding memory cell group. A history 1766 can be a number of times a memory cell group has been accessed, or the number of times a memory cell group has been subject to a particular type of programming operation.

Figure 18:
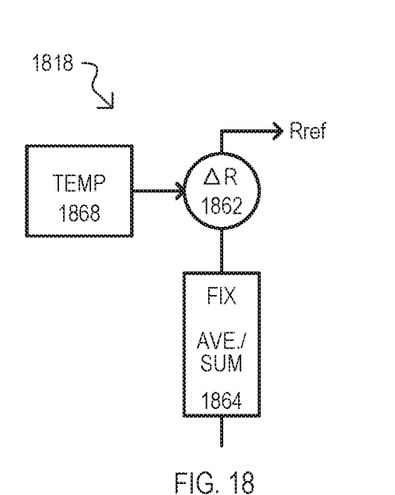
FIG. 18 is a diagram of a reference circuit according to a further embodiment.

FIG. 18 shows another reference circuit 1818 that can be included in an embodiment. Reference circuit 1818 can include a first resistance part 1864 and a second resistance part 1862. A first resistance part 1864 can take the form of 1764, or an equivalent. A second resistance part 1862 can be a variable offset resistance that can change according to a temperature history of a memory device (1868). As but one example, a memory device (e.g., integrated circuit) can include a temperature sensor to determine a temperature for the entire device and/or temperature sensors near cell groups. An offset resistance 1862 can vary according to such temperatures. In some embodiments, a history of temperature changes can be recorded, and such a history can be used to establish variable offset resistance 1862.

Resistive memory elements as described herein can take any suitable form, including but not limited to: those based on an oxidation-reduction reaction in response to applied electric fields (including or not including solid ion conduction), those based on changes in morphology (switching between amorphous state and crystalline or semi-crystalline states), and those based on changes in material property (e.g., magnetism).

It should be appreciated that reference throughout this description to "one embodiment" or "an embodiment" means that a particular feature, structure or characteristic described in connection with the embodiment is included in at least one embodiment of an invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

It is also understood that other embodiments of this invention may be practiced in the absence of an element/step not specifically disclosed herein.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A memory device, comprising:
    a plurality of cells formed as part of an integrated circuit (IC), each having a resistive element programmable between at least two different resistance states, the plurality of cells including
        memory cells configured to store data received by the memory device, and
        reference cells;
    a reference circuit formed as part of the IC configured to generate at least a first reference resistance by
        averaging the resistances of a plurality of the reference cells programmed to a first resistance state to generate a first resistance portion, and
        adding an offset resistance to the first resistance portion; and
    a sense circuit formed as part of the IC coupled to the memory cells and at least the first reference resistance and configured to compare a resistance of a selected memory cell to at least the first reference resistance to determine the data stored by the selected memory cell.

2. The memory device of claim 1, wherein:
each memory cell resistive element is programmable between a program state and an erase state, the program state having a resistance lower than the erase state; and
the first resistance state is the program state.

3. The memory device of claim 1, wherein the offset resistance varies according to any selected from: at least one determined temperature of the memory device and number of times a group of memory cells has been programmed.

4. The memory device of claim 1, wherein:
the reference circuit is configured to generate
a second reference resistance from at least one reference cell having the resistive element programmed to a second resistance state different than the first resistance state; and
the sense circuit is configured to compare the resistance of the selected memory cell to both the first reference resistance and the second reference resistance to determine the data stored by the selected memory cell.

5. The memory device of claim 4, wherein:
the reference circuit is configured to generate
the second reference resistance from a plurality of reference cells having resistive elements programmed to the second resistance state.

6. The memory device of claim 1, wherein:
each resistive element is programmable between the at least two different resistance states in response to an application of electric fields between first and second electrodes, the programming including any selected from the group of:
an oxidation-reduction reaction, and
solid ion conduction.

7. A method, comprising:
in a memory device, storing data in a plurality of memory cells by programming a resistive element in the memory cells between at least two different resistance states;
programming reference cells to at least one of the resistance states;
by operation of a reference circuit of the memory device, generating at least a first reference resistance from resistances of a plurality of reference cells; and
by operation of a sense circuit of the memory device, comparing a resistance of a selected memory cell to at least the first reference resistance to determine the data stored by the selected memory cell; wherein
generating at least the first reference resistance includes
generating a first resistance portion by averaging the resistances of the plurality of reference cells that are programmed to a first resistance state, and
adding an offset resistance to the first resistance portion.

8. The method of claim 7, wherein generating at least a first reference resistance includes generating a second reference resistance from resistances of a plurality of reference cells programmed to a second resistance state different from the first resistance state.

9. The method of claim 8, wherein:
comparing the resistance of the selected memory cell to at least the first reference resistance includes comparing the resistance of the selected memory cell to both the first reference resistance and the second reference resistance.

10. The memory device of claim 7, wherein:
the offset resistance varies according to any selected from: at least one determined temperature of the memory device and a number of times a group of memory cells has been programmed.

11. The method of claim 7, wherein:
programming the resistive element in the memory cells includes
applying electric fields between first and second electrodes of each resistive element to induce any selected from the group of:
an oxidation-reduction reaction, and
solid ion conduction.

* * * * *